United States Patent
Ganeshan et al.

(10) Patent No.: US 6,977,542 B2
(45) Date of Patent: Dec. 20, 2005

(54) ADJUSTING THE TRANS-CONDUCTANCE OF A FILTER

(75) Inventors: Saravana Kumar Ganeshan, Bangalore (IN); Srinivasan Venkatraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 152 days.

(21) Appl. No.: 10/302,887

(22) Filed: Nov. 25, 2002

(65) Prior Publication Data

US 2004/0100322 A1 May 27, 2004

(51) Int. Cl.[7] .................................................. H03K 5/00
(52) U.S. Cl. ........................ 327/553; 330/305; 327/552
(58) Field of Search .................. 327/103, 552, 327/553, 554; 330/270, 303, 305, 279, 252

(56) References Cited

U.S. PATENT DOCUMENTS

| | | | | |
|---|---|---|---|---|
| 5,650,950 A | * | 7/1997 | Siniscalchi et al. | ......... 364/607 |
| 5,914,633 A | * | 6/1999 | Comino et al. | ............. 327/553 |
| 6,172,569 B1 | * | 1/2001 | McCall et al. | ............... 330/303 |
| 6,404,277 B1 | * | 6/2002 | Lee et al. | .................... 327/552 |

FOREIGN PATENT DOCUMENTS

JP 362117407 * 5/1987

OTHER PUBLICATIONS

Francois Krummenacher and Norbert Joehl, "A 4–MHz CMOS Continuous–Time Filter with On–Chip Automatic Tuning", IEEE Journal of Solid State Circuits, vol. 23, No. 3, Jun. 1988, pp. 750–758.

Chin S. Park and Rolf Schaumann, "Design of a 4MHz Analog Integrated CMOS Transconductance –C Bandpass Filter", IEEE Journal of Solid State Circuits, vol. 23, No. 4, Aug. 1988, pp. 987–996.

J. Silva Martinez, Michiel Steyaert and Willy Sansen, "A Novel Approach for the Automatic Tuning of Continuous Time Filters", IEEE International Symposium in Circuits and Systems, 1991, pp. 1452–1455.

Un–Ku Moon and Bang– Sup Song, "Design of a Low–Distortion 22 kHz Fifth–Order Bessel Filter", IEEE Journal of Solid State Circuits, vol. 28,No. 12, Dec. 1993, pp. 1254–1264.

Un–Ku Moon and Bang– Sup Song, "A Low–Distortion 22 kHz 5th–Order Bessel Filter", IEEE International Solid–State Circuits Conference 1993, pp. 110–111, 271.

Srinivasan Venkatraman, Srikanth Natarajan, K. Radhakrishna Rao, "A New Tuning Scheme for Continuous Time Filters", 1063–9667/97, 1997 IEEE, pp. 150–154.

Scott T. Dupuie and Mohammen Ismail, "High Frequency CMOS Transconductors", Book title:"Analogue IC design : The current mode Approach"—by C. Toumazou, Chapter 5, pp. 181–231, Publisher: Peter Peregrinus Ltd; ISBN No. is 0 86341 215 7.

* cited by examiner

*Primary Examiner*—Dinh T. Le
(74) *Attorney, Agent, or Firm*—Wade James Brady, III; Frederick J. Telecky, Jr.

(57) ABSTRACT

A digital tuning circuit which generates a digital code representative of a difference of signals generated by a mirror trans-conductor circuit (having electrical characteristics similar to a trans-conductor circuit in a filter) and a reference circuit. The digital code is used to adjust the trans-conductance of both the mirror trans-conductor circuit and the filter. Some of the most/more significant bits may be used to selectively activate the respective trans-conductor elements contained in the mirror trans-conductor circuit and the filter. The remaining bits may be used to fine-tune the trans-conductance of the trans-conductor elements and the filter.

28 Claims, 7 Drawing Sheets

ADJUSTING THE TRANS-CONDUCTANCE OF A FILTER

BACKGROUND OF THE INVENTION

1. Field of the Invention

The present invention relates to filters, and more specifically to a method and apparatus for adjusting trans-conductance of a filter.

2. Related Art

A filter generally refers to a component which allows/passes a range of frequencies and rejects all other frequencies from an input signal. For example, a low pass filter allows all low frequencies below a cut off frequency (determined by filter components) and rejects all the high frequencies above cut off frequency.

Filters are often implemented within integrated circuits, and are thus characterized by trans-conductance. Trans-conductance generally provides a measure of the degree of conductivity of a filter and is represented as a reciprocal of resistance. Filter characteristics such as frequency response and amplification factor are determined by the trans-conductance value as is well known in the relevant arts.

One problem often encountered with filters is that the actual trans-conductance value is at variance with a desired value. The variance can be for reasons such as imperfections in manufacturing technologies and material, changes in operating conditions (e.g., surrounding temperature), etc. Accordingly, it is desirable to adjust the trans-conductance value of a filter during operation.

SUMMARY OF THE INVENTION

A device provided according to an aspect of the present invention may contain a filter with a trans-conductance which can deviate from a desired value ("desired trans-conductance value"), and a digital tuning circuit for tuning the trans-conductance of the filter to the desired trans-conductance value. The digital tuning circuit may provide a digital code representing an amount of correction to be performed in the filter, and the trans-conductance of the filter is adjusted according to the digital code.

In an embodiment, the digital tuning circuit contains a reference circuit generating a reference signal which is substantially constant over a desired operating range. A mirror trans-conductor circuit generates a present signal having electrical characteristics similar to the filter such that the present signal represents a present trans-conductance of the filter. A comparator generates a difference signal representing a difference of the reference signal and the present signal. A digitization circuit generates a digital code according to the difference signal. The digital code is used to adjust the trans-conductance of the mirror trans-conductor circuit and the filter.

The mirror trans-conductor circuit may contain multiple trans-conductor elements. Some of bits (most significant bits) of the digital code may be used to selectively activate the trans-conductor elements, and the other bits may be used to fine-tune the trans-conductance of the activated trans-conductor elements. A DAC may be used to convert the bits used for fine-tuning, to a corresponding analog voltage, and the analog voltage is applied to the mirror trans-conductor circuit and the filter to fine-tune the respective trans-conductance values.

The reference circuit may be implemented using a first capacitor and a second capacitor. The first capacitor is charged by a reference voltage in one phase of a clock signal and the second capacitor is charged by the first capacitor in another phase of the clock signal. The second capacitor may be implemented with high capacitance to provide the reference current. The clock signal may be generated from a source such as a crystal for stability in different operating conditions.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

FIG. (FIG.) 1 is a block diagram illustrating the details of an example device in which the present invention may be implemented.

DETAILED DESCRIPTION OF THE PREFERRED EMBODIMENTS

1. Overview and Discussion of the Invention

A tuning circuit provided according to an aspect of the present invention generates a digital code representing the extent to which the trans-conductance of a filter needs to be adjusted. The digital code is then used to adjust the trans-conductance of the filter. In an embodiment, some of the bits of the digital code are used to selectively activate (or de-activate) some of the trans-conductors present in the filter, and some other bits are used to fine-tune the trans-conductance of the activated trans-conductor circuits.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example System

Figure 1:
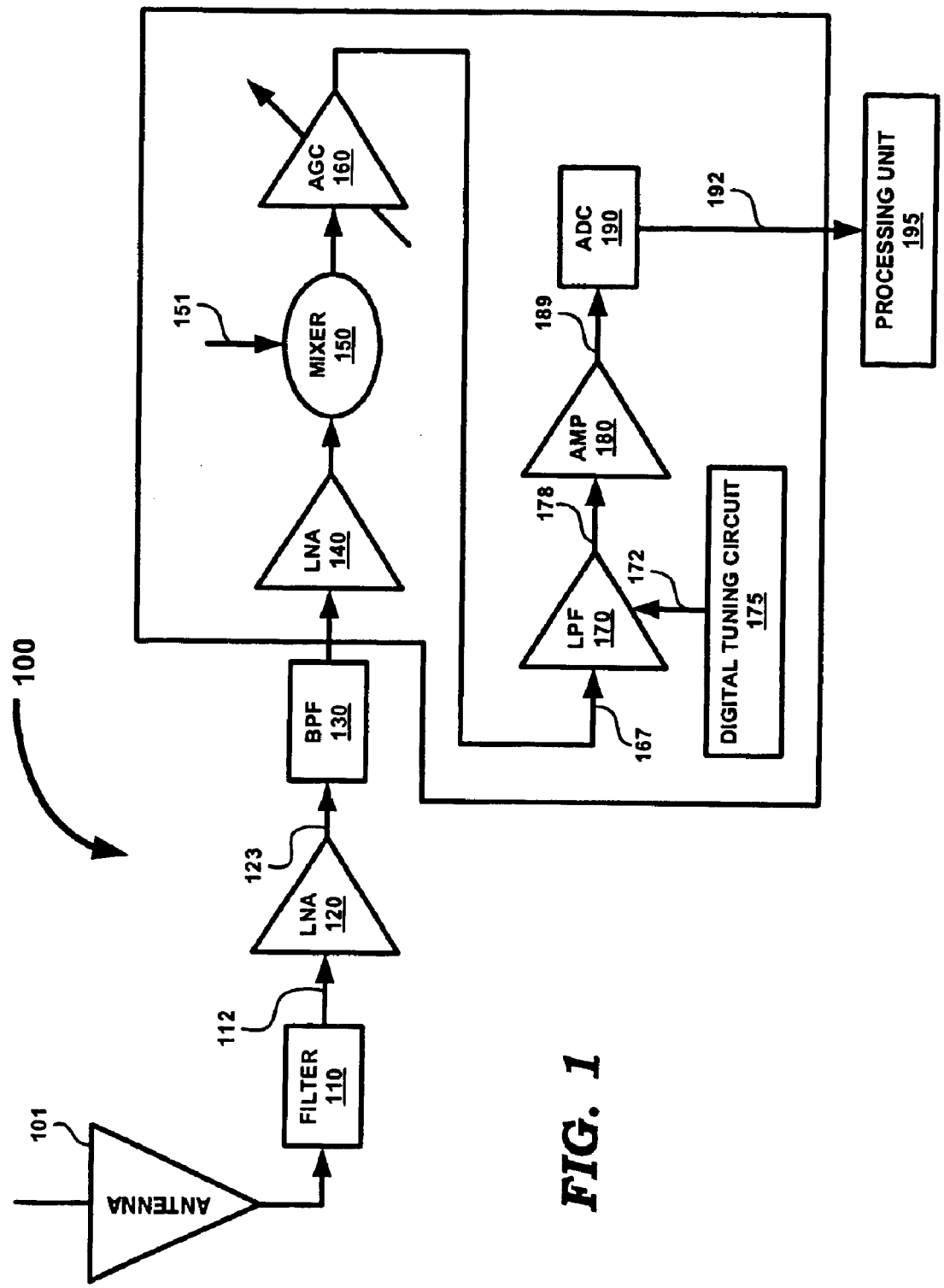

FIG. 1 is a block diagram of receiver system 100 illustrating an example system in which the present invention may be implemented. For illustration, it is assumed that receiver system 100 is implemented within a Global Positioning System Receiver. However, receiver system 100 can be implemented in other devices (e.g., mobile phone, etc.) which generally require low power consumption.

Receiver system 100 is shown containing antenna 101, filter 110, low noise amplifiers (LNA) 120 and 140, band pass filter 130, mixer 150, automatic gain controller 160, filter circuit 170, digital tuning circuit 175, amplifier 180, analog to digital converter (ADC) 190, and processing unit 195. Each component is described in further detail below.

Antenna 101 may receive various signals transmitted from satellites, etc. The received signals may be provided to filter 110. Filter 110 may perform a corresponding transfer function to generate signals of the frequencies of interest. The generated signals are provided to LNA 120. Antenna 101 and filter 110 may be implemented in a known way.

LNA 120 amplifies the signals received on line 112 to generate a corresponding amplified signal on line 123. Band pass filter (BPF) 130 may filter the amplified signal to remove any noise components that may be present. The filtered signal thus generated may be provided to LNA 140. LNA 140 may again amplify the filtered signals and provide the amplified filtered signal to mixer 150. LNAs 120 and 140, and BPF 130 may also be implemented in a known way.

Mixer 150 may be used to convert a high frequency signal to a signal having any desired frequency. In an embodiment, a signal of frequency 1575 MHz is converted to a 4 Mhz signal. Mixer 150 may receive filtered amplified signal and a signal of fixed frequency as inputs. The signal (on path 151) of fixed frequency may be generated by a phase locked loop (not shown) in a known way.

Automatic gain control (AGC) 160 may be used to amplify or attenuate the signal (from mixer 150) according to various requirements. For example, if a user using a mobile phone is in an area where the signals received are of low strength, and AGC 160 amplifies the signal accordingly. Similarly, if the user moves to an area where the signal strength is relatively higher, AGC 160 may attenuate the signal.

Filter circuit 170 may correspond to a low pass filter which allows low frequencies and rejects all other high frequencies of noise components present in the signal received on line 167. Filter circuit 170 may be implemented with trans-conductors, capacitors, etc. The filtered signal may be provided to amplifier 180 on path 178. An embodiment of filter circuit 170 is described below.

Amplifier 180 amplifies the signal received on line 178 to generate an amplified signal. The amplified signal may be provided to analog to digital converter (ADC) 190 on line 189. ADC 190 converts the analog signal received on line 189 to a corresponding digital value. The digital value may be provided to processing unit 195 on path 192 for further processing.

It may be appreciated that some of the components (for example filter circuit 170) described above are characterized by trans-conductors. One problem with trans-conductors is that trans-conductance value of the trans-conductor may change due to manufacturing technologies, operating conditions, etc. The change in trans-conductance value of trans-conductors in filter circuit 170 may change frequency response of filter circuit 170, and the output generated may not match the desired output to the change in frequency response.

Digital tuning circuit 175 provided according to an aspect of the present invention generates a digital code representing the degree to which the trans-conductance of filter circuit 170 needs to be adjusted. The digital code can be used to adjust/tune the trans-conductance of the filters. The manner in which the digital code can be generated is described below with FIG. 2.

3. Method

Figure 2:
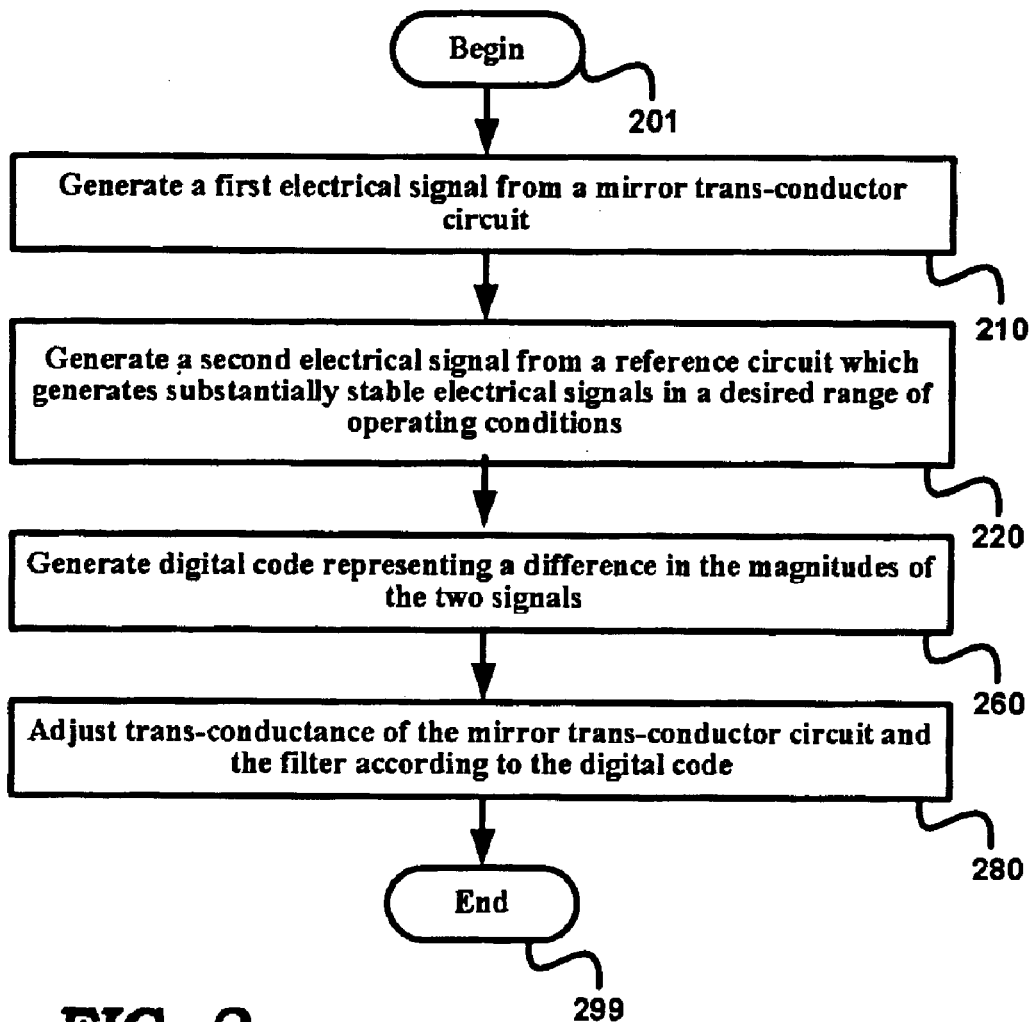
FIG. 2 is a flow-chart illustrating the manner in which a digital code may be generated within a digital tuning circuit in an aspect of the present invention.

FIG. 2 is a flowchart illustrating the manner in which a digital code may be generated according to an aspect of the present invention. The method is described with reference to filter circuit 170 of FIG. 1 for illustration. However, the method can be implemented in (and along with) other components as well. The method begins in step 201 in which control passes to step 210.

In step 210, a first electrical signal is generated from a mirror trans-conductor circuit, which has similar trans-conductance characteristics as filter circuit 170 (the trans-conductance of the component sought to be tuned/adjusted). For example, the mirror trans-conductor circuit may be implemented as a replica of the trans-conductor circuit(s) in filter circuit 170. Thus, the first electrical signal represents the present trans-conductance of the component sought to be tuned.

In step 220, a second electrical signal is generated from a reference circuit which generates substantially stable electrical signal in a desired range of operating conditions. The magnitude of the electrical signal needs to be designed to reflect a desired trans-conductance for filter circuit 170. As the second electrical signal is stable (independent of manufacturing variations, operating conditions etc.) and reflects the desired trans-conductance, the signal can be used as a reference to adjust the trans-conductance of the filter and the mirror trans-conductor circuit.

In step 260, a digital code representing a difference of the magnitudes of the two electrical signals is generated. The digital code can be generated using one of many possible approaches. An example approach is described below in further detail.

In step 280, trans-conductance values of the mirror trans-conductor circuit and the filter are adjusted according to the digital code. By adjusting the trans-conductance of both the components in a similar manner, the first electrical signal generated by the mirror trans-conductor circuit would continue to reflect the trans-conductance of the filter in different operating conditions. The method ends in step 299.

The above steps may be repeated multiple times to adjust the trans-conductance of mirror trans-conductor circuit (and thus filter 170) until the two electrical signals are substantially equal. Thus, it may be readily appreciated that the digital code represents the degree of difference between trans-conductance value with a desired value. The digital code can accordingly be used to adjust the trans-conductance of filter circuit 170 to obtain desired frequency response. An example digital tuning circuit 175 generating the digital code of method of FIG. 2 is described below.

4. Digital Tuning Circuit

Figure 3:
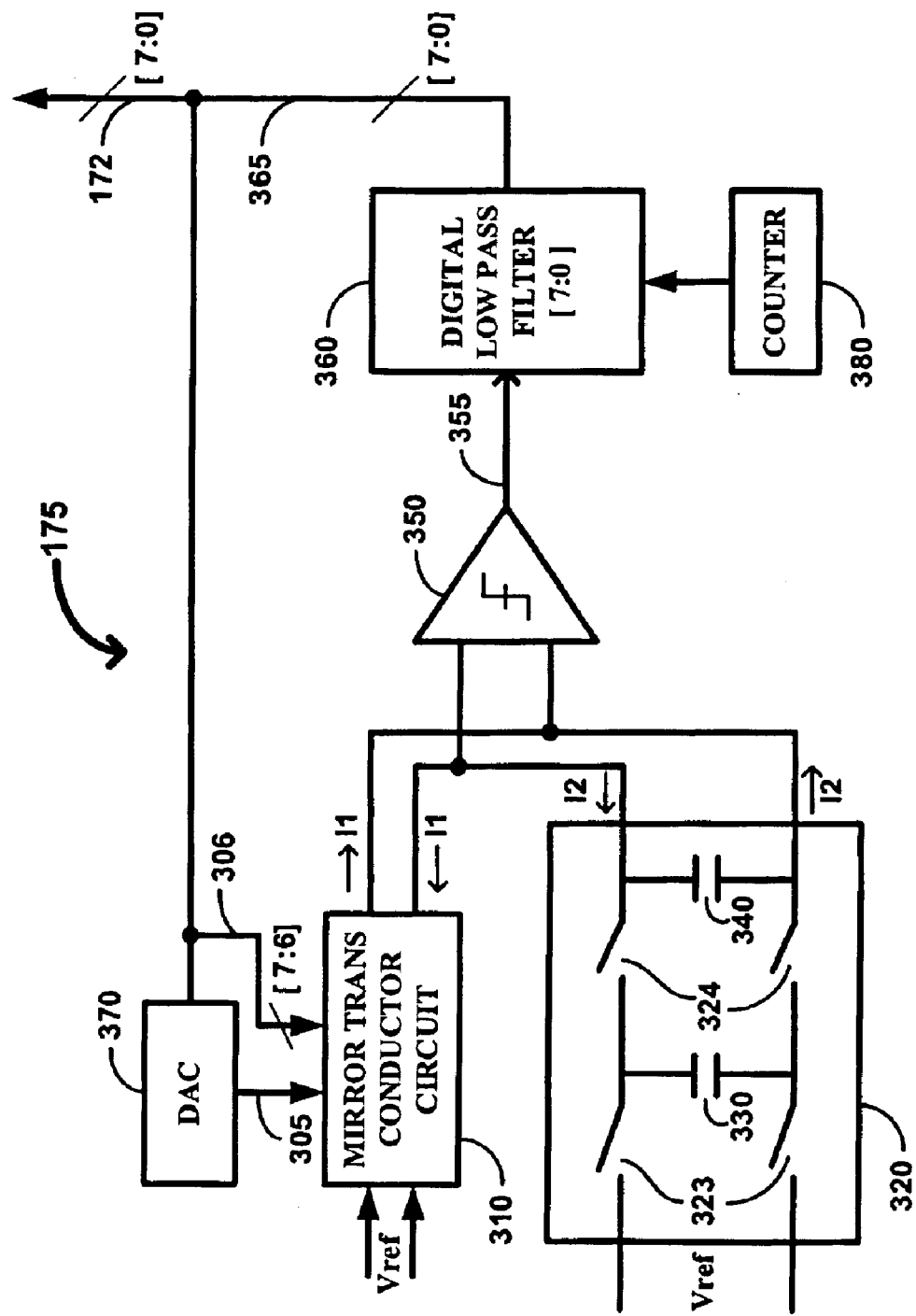
FIG. 3 is a circuit diagram illustrating the details of a digital tuning circuit in an embodiment of the present invention.

FIG. 3 is a circuit diagram illustrating the details of digital tuning circuit 175 in one embodiment. Digital tuning circuit 175 is shown containing mirror trans-conductor circuit 310, reference circuit 320, comparator 350, digital low pass filter 360, digital to analog converter (DAC) 370, and counter 380. Each component is described below.

DAC 370 receives on path 365 some of the bits of digital code, and converts the received bits to an analog signal. The analog signal forms a control voltage (on path 305) used to adjust the trans-conductance of mirror trans-conductor circuit 310 as described below. The manner in which the control voltage and the bits not received (most significant bits on path 306) are used in adjusting the trans-conductance of mirror trans-conductor circuit 310 is described in further detail below.

Mirror trans-conductor circuit 310 is designed to adjust the trans-conductance value according to a control voltage (received on line 305) and bit(s) received on path 306. The bits on path 306 may represent the bits of digital code which are not applied to (provided as input) DAC 370. The bits on path 306 are used to select among the various trans-conductor stages, while the received bits are used to fine-tune the trans-conductance within the selected stages. The manner in which the trans-conductance can be adjusted, will be clearer from the description of the details of low pass filter 170 with reference to FIGS. 4, 5 and 6.

Mirror trans-conductor circuit 310 generates current I1 according to the changed trans-conductance and the voltage level of Vref. Vref may be implemented in the form of constant D.C. voltage. As Vref is maintained constant, the current I1 generated by trans-conductance circuit 310 depends on the effective trans-conductance after the change. Mirror trans-conductor circuit 310 may be implemented as a replica (i.e., same material, component, etc.) of trans-conductor circuit in filter circuit 170.

Reference circuit 320 generates current I2, which remains stable in various operating conditions. Reference circuit 320 needs to be implemented to generate current I2 reflecting a desired trans-conductance value of filter circuit 170. In an embodiment, reference circuit 320 is implemented by using a stable frequency $f_{sam}$ generated by an external crystal (not shown), and capacitors 330 and 340 as described below.

As may be appreciated, crystals can be implemented to generate a stable frequency $f_{sam}$, which is independent of temperature changes, or other operating conditions. The frequency is described as containing two phases φ1 and φ2, which respectively control switches 323 and 324.

Capacitor 330 is implemented with a small capacitance value (having an order of magnitude equal to capacitor in LPF 170), and is charged in phase φ1 (when switch 323 is closed) by voltage Vref. Due to the small capacitance, capacitor 330 may be charged quickly in phase φ1. In phase φ2, capacitor 330 discharges when switch 323 is open and switch 324 is closed. Due to the quick charging and discharging, capacitor 330 may be viewed as generating impulsive current.

Capacitor 340 is implemented with a large capacitance value, and is charged in phase φ2 by capacitor 330 operating as a voltage source. Due to the large capacitance value, capacitor 340 charges and discharges slowly, and operates as an integrator of the impulsive current generated by capacitor 330. Accordingly, capacitor 340 provides a constant current I2 as an input to comparator 350. The voltage Vref (in an embodiment equals about 100 milli-volts) and frequency $f_{sam}$ (can be chosen by a designer) need to be selected to ensure that the constant current I2 reflects a reference desired trans-conductance value. In an embodiment, I2=Vref×$f_{sam}$ X capacitance of capacitor 330, wherein 'x' represents multiplication operation.

Comparator 350 compares two input currents I1 and I2, and generates on path 355 a difference signal representing the difference between the two currents I1 and I2. In an embodiment, the difference signal is provided in the form of a digital value (difference value). Comparator 350 may be implemented in a known way.

Digital low pass filter 360 receives the difference signal on line 355, and generates a digital code representing the extent to which filter 170 is to be tuned in relation to the desired trans-conductance set by reference circuit 320. The digital code is generated based on the difference signal received on line 355 in several comparison cycles. Digital low pass filter 360 operates as a digitization circuit in converting the difference signal to a digital code. In a steady state, the difference value may equal zero, and yet digital low pass filter 360 may continue to generate the same digital code.

On the other hand, when the filter is being tuned, the difference value may be positive or negative, and the digital code is correspondingly adjusted in an attempt to drive the difference value towards zero in future iterations. Due to the operation of low pass filter, the digital code is adjusted by small values in multiple iterations even if a large difference value is encountered in a specific iteration.

In an embodiment, digital low pass filter 360 is implemented as an 8-bit up-down counter. The number of bits in digital low pass filter 360 is determined by the maximum error in trans-conductance value (of filter circuit 170) that digital tuning circuit 175 is to be designed for.

Counter 380 is used to generate a stop signal which prevents digital low pass filter 360 from further changing the generated digital code after 2^8 cycles. Such a feature is implemented based on the assumption that the accurate digital code is attained in that many cycles. Thus, counter 380 counts the number of cycles from a start point, and generates the stop signal after 2^8 cycles. The counter may be reset periodically to check whether filter 170 needs to be tuned further. In the time duration when counter generates the stop signal, external crystal (all components except DAC 370), etc., may also be disabled to minimize power consumption.

Thus, it may be appreciated that digital low pass filter 360 generates a digital code every clock cycle. As noted above, some of the bits (most significant bits) are used to select among the various trans-conductor stages, and the remaining bits are used to fine-tune the trans-conductance within the selected stages. Such an adjustment generally needs to parallel the adjustment of trans-conductance value within low pass filter 170. Accordingly, the manner in which the trans-conductance of low pass filter 170 may be adjusted is described below.

5. Trans-Conductor Circuit within Filter Circuit

An embodiment of trans-conductor circuit within filter circuit (and in mirror trans-conductor circuit 310 as well) contains multiple trans-conductor stages which are selectively activated by some of the bits of the digital code. The activation (and deactivation) of the stages causes the effective trans-conductance of the trans-conductor circuit to be correspondingly changed in large quantum (step sizes). The remaining bits of the digital code can then be used to fine-tune the trans-conductance.

The details of such an illustrative embodiment and a graph depicting the operation are described below with reference to FIGS. 5 and 6 respectively. However, the operation and advantages may be clearer by appreciating the potential inadequacy in addressing a desired broad operating range by using a single stage in a trans-conductor circuit, as described below with reference to FIG. 4.

Figure 4:
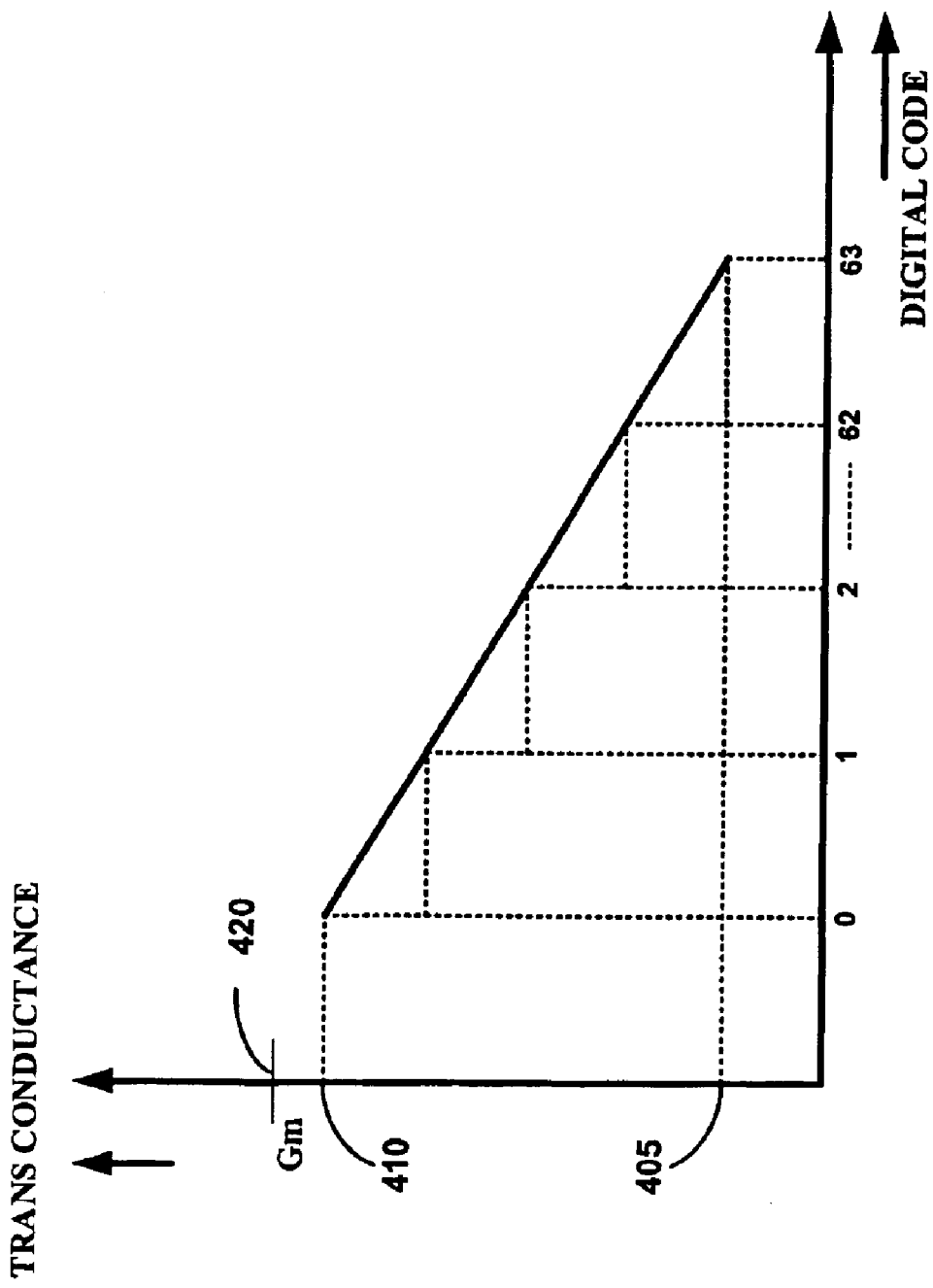
FIG. 4 contains a graph illustrating the details of change in trans-conductance value for a digital code with a single trans-conductor stage in an embodiment of the present invention.

FIG. 4 is a graph illustrating the details of change in trans-conductance value of a filter circuit when all the bits of a digital code are used to tune the trans-conductance of an embodiment of a single trans-conductor stage. The frequency response ($f_{3db}$) of the filter circuit 170 changes with change in trans-conductance value. In general, a desired frequency response ($f_{3db}$) is obtained by adjusting the filter circuit to desired trans-conductance value.

A control voltage (which changes the trans-conductance) generated according to a digital code (number of combinations possible are 64) generally changes trans-conductance value linearly in steps between upper limit 410 and lower limit 405 as shown in FIG. 4. Assuming that a value 420 is required for the effective trans-conductance, that value may not be obtained using a single trans-conductor stage as the value 420 falls outside of the range 405 through 410. Accordingly, multiple trans-conductor stages may be used within a trans-conductor circuit according to an aspect of the present invention as described below with FIGS. 5 and 6.

Figure 5:
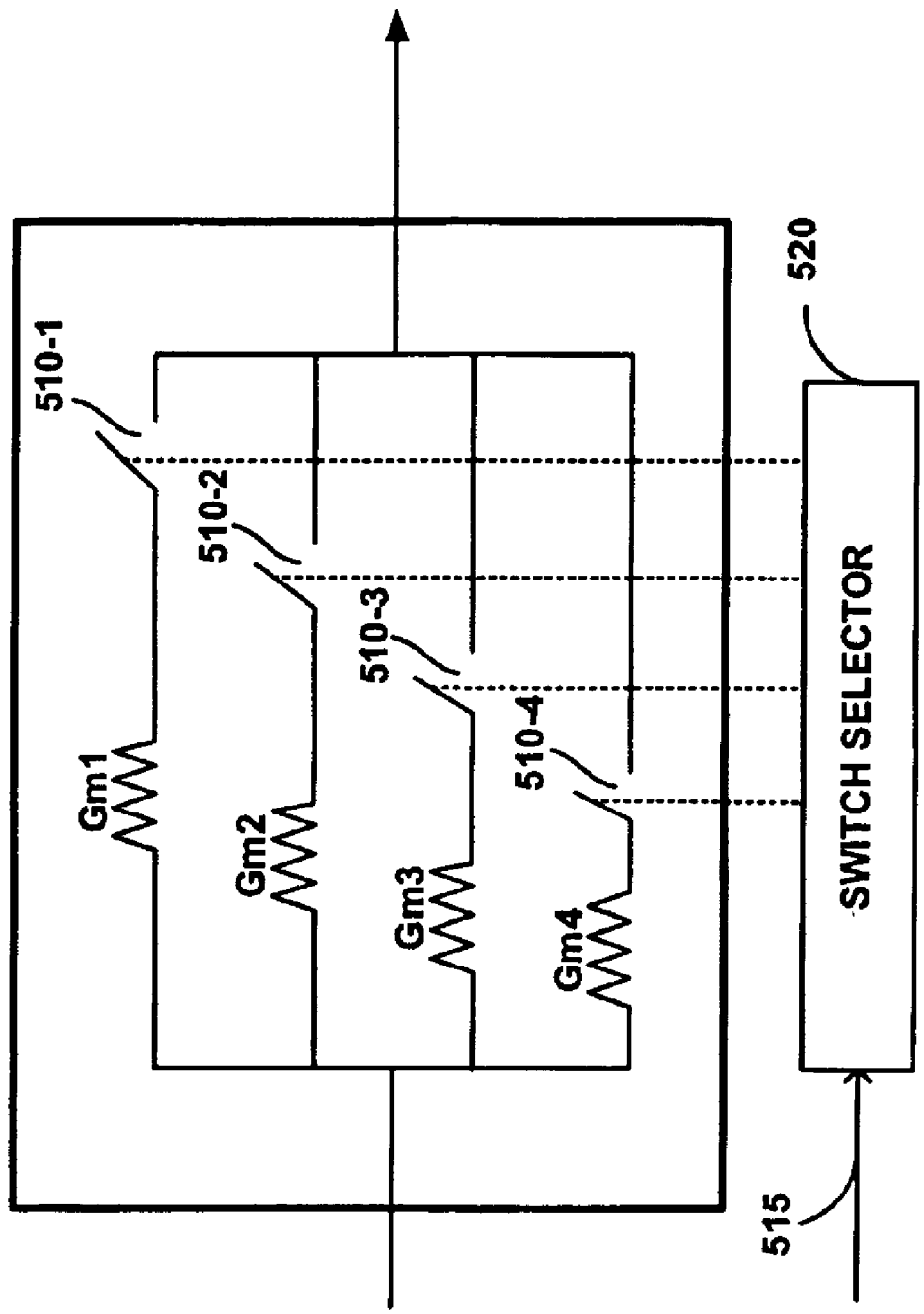
FIG. 5 is a circuit diagram illustrating the details of mirror trans-conductor circuit with four trans-conductor stages in an embodiment of the present invention.

FIG. 5 is a circuit diagram illustrating the details of trans-conductor circuit within filter circuit 170 in an embodiment of the present invention. The trans-conductor circuit is shown containing four trans-conductor stages (Gm1, Gm2, Gm3, and Gm4), switches 510-1 through 510-4 and switch selector 520. Each component is described below.

Trans-conductor stages Gm1, Gm2, Gm3, and Gm4 are respectively connected in series with switches 510-1 through 510-4. Switches 510-1 through 510-4 are either connected or disconnected by switch selector 520. Accordingly, four trans-conductor stages (Gm1, Gm2, Gm3, and Gm4) are either placed in connected or disconnected configuration.

Switch selector 520 receives two MSBs on path 515 of 8-bit digital code and may generate control signals to switches 510-1 through 510-4. In an embodiment, only one of the four trans-conductor stages is placed in a connected configuration (and the others in disconnected configuration). In such a situation, the four trans-conductor elements may individually provide different ranges of trans-conductance values, and only one of the stages may be selectively placed in a connected configuration.

However, in alternative embodiments, more trans-conductor stages can be placed in connected configuration at the same time to attain a desired range of trans-conductance values. The specific stages to be placed in connected configuration can again be determined by switch selector 520 based on some of the bits of the digital code. Irrespective of the specific approach chosen, the trans-conductance values of the embodiments may be characterized according to the graph of FIG. 6.

Figure 6:
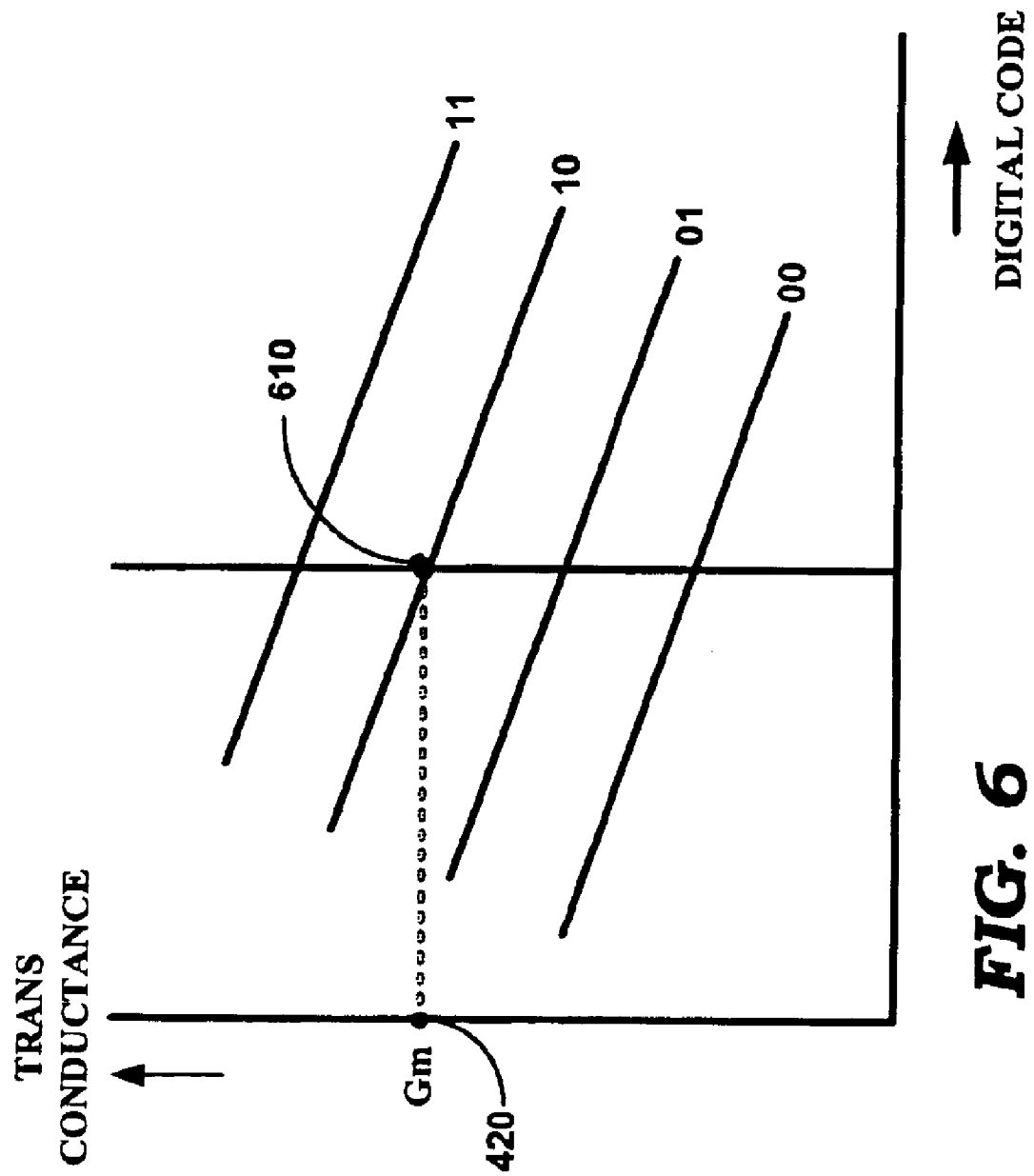
FIG. 6 contains a graph illustrating the details of change in trans-conductance value for a digital code with four trans-conductor stages.

FIG. 6 is a graph illustrating the details of the range of available trans-conductance values of filter circuit 170 when two bits are used to select the trans-conductor stages. Four lines are shown corresponding to the four possible values 00, 01, 10, and 11 of the two bits. The position of each line (covering a range of trans-conductance values) generally depends on the trans-conductance values in the connected stages. As noted above, one or more trans-conductor stages can be connected to attain a corresponding range of trans-conductance values.

It may be observed that a desired trans-conductance value of 420 may be attained using either of the curves corresponding to bit values 10 (at point 610) and 11. Thus, the different lines/curves are selected according to the most significant bits of the digital code, and the remaining bits may be used to obtain a specific point on the selected line. Mirror trans-conductor circuit 310 in digital tuning circuit 175 may also be implemented with similar multiple trans-conductor stages as in filter circuit 170.

The manner in which digital tuning circuit 175 converges with multiple trans-conductor stages is described below with FIG. 7.

Figure 7:
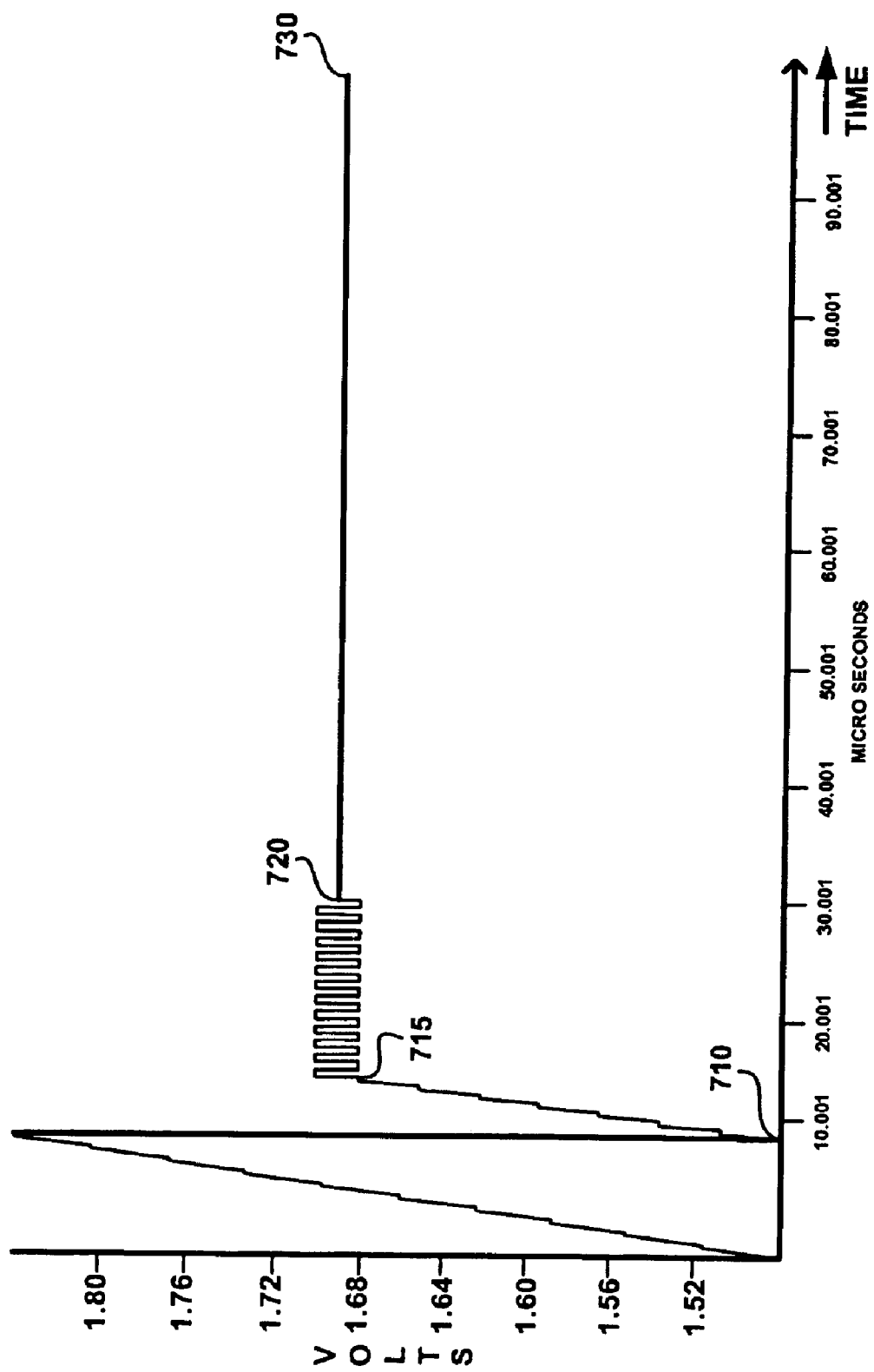
FIG. 7 is a graph illustrating the manner in which digital tuning circuit converges with multiple trans-conductor stages.

FIG. 7 is a graph illustrating the details of convergence of digital tuning circuit 175 with multiple trans-conductor stages. Digital tuning circuit 175 is shown tuning the mirror trans-conductor circuit and the filter circuit gradually between time points 710 and 715. After digital tuning circuit 175 converges at time point 715, the control voltage on line 305 corresponding to a digital code may toggle between two values. Accordingly, a square wave is shown between time points 715 and 720.

After 2^8 cycles from time point 710, counter 380 causes the present digital code generated by digital low pass filter 360 to be 'frozen' (maintained the same), and the components in the loop (e.g., DAC 370, mirror trans-conductor 310 and comparator 350) to be turned-off for minimizing power consumption. Accordingly, the digital value is shown at a constant value between time points 720 and 730. The value in counter 380 may be reset after some time to activate the components in the loop.

Thus, an embodiment of a digital tuning circuit provided according to the present invention minimizes power consumption while enabling a filter to be tuned.

6. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of tuning the trans-conductance of a filter having a trans-conductor circuit to a desired value, said method comprising the steps of providing a mirror trans-conductor circuit having electrical characteristics similar to said filter;

generating a reference signal which is substantially constant over a desired operating range;

generating a present signal from a said mirror trans-conductor circuit having electrical characteristics similar to said filter such that said present signal represents a present trans-conductance of said filter;

generating a digital code according to a difference of said reference signal and said present signal; and tuning said filter and said mirror trans-conductor circuit using said digital code.

2. The method of claim 1, wherein said reference signal comprises a reference current and said present signal comprises a present current.

3. The method of claim 2, wherein said tuning comprises:

using a more significant bit of said digital code to selectively activate a trans-conductor stage in both of said mirror trans-conductor circuit and said filter; and fine-tuning both of said trans-conductor stage and said mirror trans-conductor circuit according to a lesser significant bit of said digital code.

4. An integrated circuit comprising:

a filter with a desired trans-conductance value, wherein the trans-conductance of said filter can deviate from said desired trans-conductance value, and a digital tuning circuit for tuning the trans-conductance of said filter to said desired trans-conductance value, said digital tuning circuit comprising:

means for generating a reference signal which is substantially constant over a desired range;

means for generating a present signal from a mirror trans-conductor circuit having electrical characteristics similar to said filter such that said present signal represents a present trans-conductance of said filter;

means for generating a digital code having more significant and less significant bits according to a difference of said reference signal and said present signal; and means for tuning said filter and said mirror trans-conductor circuit using said digital code.

5. The integrated circuit of claim 4, wherein said reference signal comprises a reference current and said present signal comprises a present current.

6. The integrated circuit of claim 5, wherein said means for tuning comprises:

means for using at least one more significant bit of said digital code to selectively activate a trans-conductor stage in both of said mirror trans-conductor circuit and said filter; and means for fine-tuning both of said trans-conductor stage and said mirror trans-conductor circuit according to at least one lesser significant bit of said digital code.

7. A digital tuning circuit for tuning the transconductance of a transconductor to a desired trans-conductance value, said digital tuning circuit comprising:

a reference circuit generating a reference signal which is substantially costant over a desired operating range;

a mirror trans-conductor circuit generating a present signal having electrical characteristics similar to said transconductor such that said present signal represents a present trans-conductance of said transconductor;

a comparator generating a difference signal representing a difference of said reference signal and said present signal; and a digitization circuit generating a digital code according to said difference signal, wherein said digital code is used to adjust the trans-conductance of said mirror trans-conductor circuit and said transconductor.

8. The digital tuning circuit of claim 7, wherein said reference signal comprises a reference current and said present signal comprises a present current.

9. The digital tuning circuit of claim 8, wherein said mirror trans-conductor circuit comprises a plurality of trans-conductor elements, and wherein one or more of the most significant bits of said digital code is used to selectively connect one of said plurality of trans-conductor elements, and wherein one or more of the least significant bits (LSBs) is used to fine-tune the trans-conductance of said one of said plurality of trans-conductor elements.

10. The digital tuning circuit of claim 9, wherein said reference circuit comprises a reference voltage, a first capacitor and a second capacitor, wherein said first capacitor is charged by a reference voltage in one phase of a clock signal and said second capacitor is charged by said first capacitor in another phase of said clock signal, wherein said second capacitor provides said reference current.

11. The digital tuning circuit of claim 10, wherein said clock signal is generated from a crystal controlled clock circuit.

12. The digital tuning circuit of claim 11, wherein said present current is generated by applying said reference voltage to said plurality of trans-conductor elements.

13. The digital tuning circuit of claim 9, wherein said digitization circuit comprises a low pass filter.

14. The digital tuning circuit of claim 9, further comprising a digital to analog converter (DAC) receiving said one or more of the LSBs and generating a corresponding analog voltage, wherein said corresponding analog voltage is used to fine-tune the trans-conductance of said mirror trans-conductor circuit.

15. The digital tuning circuit of claim 14, further comprising a register coupled to said low pass filter counting up to a pre-specified number, wherein said DAC is powered-off when said register counts to said pre-specified number.

16. The digital tuning circuit of claim 9, wherein said transconductor comprises a filter.

17. A device comprising:

a transconductor having a desired trans-conductance value, the trans-conductance of said transconductor deviatable from said desired trans-conductance value; and a digital tuning circuit providing a digital code responsive to a reference desired transconductance which is substantially constant over a desired operating range including said desired trans-conductance value for adjusting the trans-conductance of said transconductor to said desired trans-conductance value, said digital code representing an amount of adjustment to be performed to said transconductor.

18. A device comprising:

a transconductor with a desired trans-conductance value, the trans-conductance of said transconductor deviatable from said desired trans-conductance value; and a digital tuning circuit for tuning the trans-conductance of said transconductor to said desired trans-conductance value, said digital tuning circuit providing a digital code to said transconductor representing an amount of adjustment o be performed to said transconductor, said digital code adjusting the trans-conductance of said transconductor;

wherein said digital tuning circuit comprises:

a reference circuit generating a reference signal which is substantially constant over a desired operating range;

a mirror trans-conductor circuit generating a present signal having electrical characteristics similar to said transconductor such that said present signal represents a present trans-conductance of said transconductor;

a comparator generating a difference signal representing a difference of said reference signal and said present signal; and a digitization circuit generating a digital code according to said difference signal, wherein said digital code is used to adjust the trans-conductance of said mirror trans-conductor circuit and said transconductor.

19. The device of claim 18, wherein said reference signal comprises a reference current and said present signal comprises a present current.

20. The device of claim 19, wherein said mirror trans-conductor circuit comprises a plurality of trans-conductor elements, and wherein one or more of the most significant bits of said digital code is used to selectively connect one of said plurality of trans-conductor elements, and wherein one or more of the least significant bits (LSBs) is used to fine-tune the trans-conductance of said one of said plurality of trans-conductor elements.

21. The device of claim 20, wherein said reference circuit comprises a first capacitor and a second capacitor, wherein said first capacitor is charged by a reference voltage in one phase of a clock signal and said second capacitor is charged by said first capacitor in another phase of said clock signal, wherein said second capacitor provides said reference current.

22. The device of claim 21, wherein said present current is generated by applying said reference voltage to said plurality of trans-conductor elements.

23. The device of claim 20, wherein said digitization circuit comprises a low pass filter.

24. The device of claim 20, further comprising a digital to analog converter (DAC) receiving said one or more of the LSBs and generating a corresponding analog voltage, wherein said corresponding analog voltage is used to fine-tune the trans-conductance of said mirror trans-conductor circuit.

25. The device of claim 24, further comprising a register counting up to a pre-specified number, wherein said DAC is powered-off when said register counts to said pre-specified number.

26. The device of claim 20, wherein said transconductor comprises a filter.

27. The device of claim 20, wherein said device comprises one of a mobile phone and a global positioning system receiver.

28. The device of claim 21, wherein said clock signal is generated from a crystal controlled clock circuit.

* * * * *